United States Patent
Lee et al.

(10) Patent No.: US 10,910,047 B2
(45) Date of Patent: Feb. 2, 2021

(54) STORAGE DEVICE AND METHOD OF OPERATING THE SAME

(71) Applicant: SK hynix Inc., Gyeonggi-do (KR)

(72) Inventors: Un Sang Lee, Chungcheongbuk-do (KR); Chi Wook An, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/440,174

(22) Filed: Jun. 13, 2019

(65) Prior Publication Data

US 2020/0160906 A1  May 21, 2020

(30) Foreign Application Priority Data

Nov. 15, 2018 (KR) .................. 10-2018-0141145

(51) Int. Cl.
| | |
|---|---|
| *G11C 29/02* | (2006.01) |
| *G11C 11/56* | (2006.01) |
| *G11C 16/08* | (2006.01) |
| *G06F 11/14* | (2006.01) |
| *G11C 16/28* | (2006.01) |
| *G11C 16/16* | (2006.01) |

(52) U.S. Cl.
CPC ........ *G11C 11/5642* (2013.01); *G06F 11/141* (2013.01); *G11C 11/5635* (2013.01); *G11C 16/08* (2013.01); *G11C 16/16* (2013.01); *G11C 16/28* (2013.01)

(58) Field of Classification Search
CPC ..................................................... G11C 29/028
USPC ........................................................ 365/201
See application file for complete search history.

(56) References Cited

U.S. PATENT DOCUMENTS 9,773,565 B1 * 9/2017 Yeh .................. G11C 29/028

FOREIGN PATENT DOCUMENTS

| KR | 10-2013-0084901 | 7/2013 |
|---|---|---|
| KR | 10-2017-0065076 | 6/2017 |

* cited by examiner

*Primary Examiner* — Jason Lappas
(74) *Attorney, Agent, or Firm* — IP & T Group LLP

(57) ABSTRACT

A storage device includes a memory device configured to perform a read operation on a selected word line among a plurality of word lines, and a memory controller configured to control the memory device to: perform the read operation, perform a read retry operation on the selected word line, by changing a read voltage level, when the read operation fails, and perform an additional read retry operation on the selected word line, by changing the read voltage level and an application time of voltages related to the read operation, depending on whether the selected word line is a set word line, when the read retry operation fails.

20 Claims, 12 Drawing Sheets

READ RETRY TABLE

| Read Retry WLs | Read Retry Count | Read Level sets | | | Read Timing Info |
|---|---|---|---|---|---|
| | | Vr1 | Vr2 | Vr3 | |
| Normal WLs, Set WLs | 1 | Vr1_1 | Vr2_1 | Vr3_1 | — |
| | 2 | Vr1_2 | Vr2_2 | Vr3_2 | — |
| | 3 | Vr1_3 | Vr2_3 | Vr3_3 | — |
| | 4 | Vr1_4 | Vr2_4 | Vr3_4 | — |
| | (5) | Vr1_5 | Vr2_5 | Vr3_5 | — |
| Set WLs | 6 | Vr1_6 | Vr2_6 | Vr3_6 | Timeinfo_1 |
| | 7 | Vr1_7 | Vr2_7 | Vr3_7 | Timeinfo_2 |
| | (8) | Vr1_8 | Vr2_8 | Vr3_8 | Timeinfo_3 |

Th1

Th1+Th2

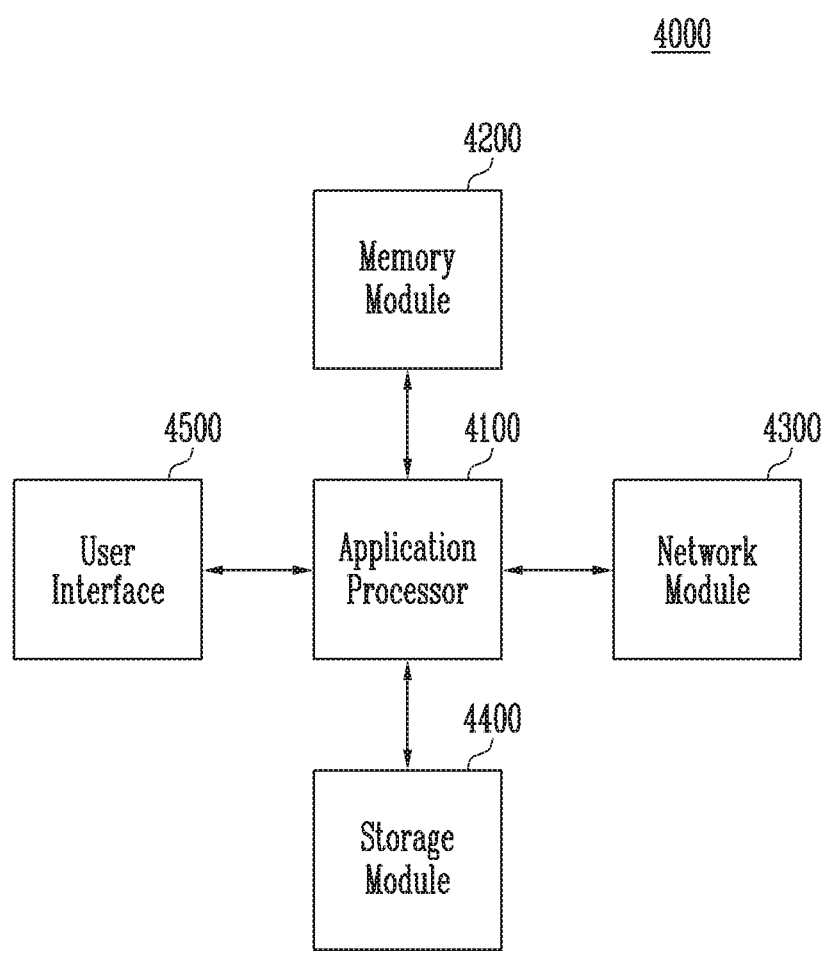

US 10,910,047 B2

STORAGE DEVICE AND METHOD OF OPERATING THE SAME

CROSS-REFERENCE TO RELATED APPLICATION

The present application claims priority under 35 U.S.C. § 119(a) to Korean patent application number 10-2018-0141145, filed on Nov. 15, 2018, which is incorporated herein by reference in its entirety.

BACKGROUND

Field of Invention

Various embodiments of the present disclosure generally relate to an electronic device, and more particularly, to a storage device and a method of operating the storage device.

Description of Related Art

Generally, a storage device stores data under control of a host device such as a computer or a smartphone. The storage device may include a memory device configured to store data, and a memory controller configured to control the memory device. Memory devices are chiefly classified into volatile memory devices and nonvolatile memory devices.

A volatile memory device stores data only when power is supplied thereto; data stored therein is lost when power is turned off. Examples of a volatile memory device include a static random access memory (SRAM), and a dynamic random access memory (DRAM).

Data stored in a nonvolatile memory device is retained even when power is turned off. Examples of a nonvolatile memory device include a read-only memory (ROM), a programmable ROM (PROM), an electrically programmable ROM (EPROM), an electrically erasable programmable ROM (EEPROM), and a flash memory.

SUMMARY

Various embodiments of the present disclosure are directed to a storage device capable of improving the reliability of a read operation on a set word line, and a method of operating the storage device.

An embodiment of the present disclosure may provide for a storage device including: a memory device configured to perform a read operation on a selected word line among a plurality of word lines, and a memory controller configured to control the memory device to: perform the read operation, perform a read retry operation on the selected word line, by changing a read voltage level, when the read operation fails, and perform an additional read retry operation on the selected word line, by changing the read voltage level and an application time of voltages related to the read operation, depending on whether the selected word line is a set word line, when the read retry operation fails.

An embodiment of the present disclosure may provide for a method of operating a storage device including a memory device configured to perform a read operation on a selected word line among a plurality of word lines, and a memory controller configured to control the memory device, the method comprising: performing, when the read operation fails, a read retry operation, by changing a read voltage level, and performing, when the read retry operation fails, an additional read retry operation, by changing the read voltage level and an application time of voltages related to the read operation, depending on whether the selected word line is a set word line.

An embodiment of the present disclosure may provide for a memory controller configured to control a memory device including a plurality of word lines, the memory controller including: a read operation controller configured to control the memory device to perform a read operation on a selected word line of the plurality of word lines, perform, when the read operation fails, a read retry operation, by changing a read voltage level, and perform, when the read retry operation fails, an additional read retry operation, by changing the read voltage level and an application time of voltages related to the read operation, depending on whether the selected word line is a set word line, and a read retry table storage configured to store information about read voltage levels to be used for the read retry operation and the additional read retry operation and information about the application time of voltage, received from the memory device.

An embodiment of the present disclosure may provide for a storage device including: a memory device including a plurality of word lines, and a memory controller suitable for controlling the memory device to: perform a read operation on a selected word line, among the plurality of word lines, based on a selected read voltage level, when it is determined that the read operation failed, perform a read retry operation on the selected word line, based on a first read voltage level different than the selected read voltage level for a first voltage application time of voltage, when it is determined that the read retry operation failed, determining whether the selected word line is a specific type of word line, and when it is determined that the selected word line is the specific type of word line, perform an additional read retry operation on the selected word line, based on a second read voltage level different than the selected voltage level and the first voltage level for a second voltage application time different than the first voltage application time.

BRIEF DESCRIPTION OF THE DRAWINGS

FIG. 13 is a block diagram illustrating a user system to which the storage device in accordance with an embodiment of the present disclosure is applied.

DETAILED DESCRIPTION

Figure 1:
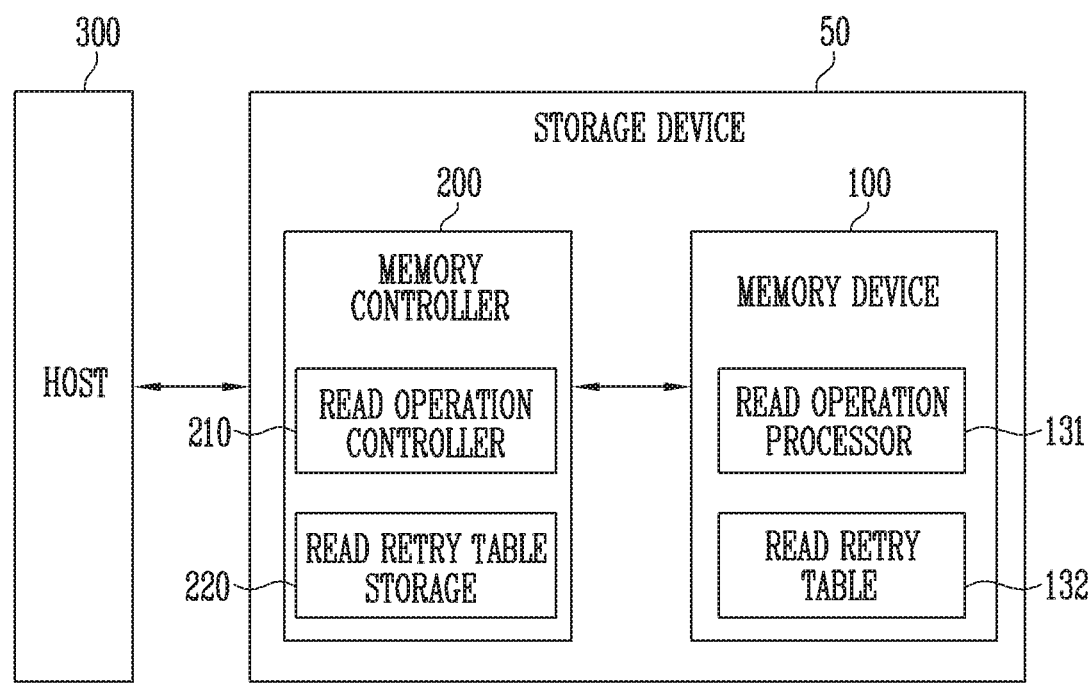
FIG. 1 is a diagram illustrating a storage device in accordance with an embodiment of the present disclosure.

Specific structural and functional description in this specification is directed to embodiments of the present disclosure. However, the present invention is not limited to the description or any of the specific embodiments described. Also, throughout the specification, reference to "an embodiment" or the like is not necessarily to only one embodiment, and different references to any such phrase are not necessarily to the same embodiment(s).

Rather, the present invention may be embodied in many different forms, which may be variations or modifications of any of the disclosed embodiments. Thus, the present invention should be construed as covering modifications, equivalents and alternatives that fall within the spirit and scope of the present disclosure.

It will be understood that, although the terms "first", "second", etc. may be used herein to identify various elements, these elements should not be limited by these terms. These terms are only used to distinguish one element from another element that otherwise have the same or similar names. For example, a first element in one instance could be termed a second element in another instance, and vice versa, without departing from the teachings of the present disclosure.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or directly adjacent to" should be construed in the same way.

The terminology used herein is for the purpose of describing particular embodiments only and is not intended to be limiting. In the present disclosure, the singular forms are intended to include the plural forms and vice versa, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and not be interpreted in an idealized or overly formal sense unless expressly so defined herein.

Detailed description of functions and structures well known to those skilled in the art is omitted to avoid obscuring the subject matter of the present disclosure. This aims to omit unnecessary description so as to make the subject matter of the present disclosure clear.

The present disclosure is explained in detail below in the context of various embodiments with reference to the accompanying drawings.

FIG. 1 is a diagram illustrating a storage device 50 in accordance with an embodiment of the present disclosure.

Referring to FIG. 1, the storage device 50 may include a memory device 100 and a memory controller 200 configured to control the operation of the memory device 100. The storage device 50 may be a device configured to store data under control of a host 300 such as a cellular phone, a smartphone, an MP3 player, a laptop computer, a desktop computer, a game machine, a television (TV), a tablet personal computer (PC), or an in-vehicle infotainment system.

The storage device 50 may be configured as any of various kinds of storage devices depending on a host interface, which is a communication system with the host 300. For example, the data storage device 50 may be configured as a solid state drive (SSD), a multimedia card (MMC), an embedded MMC (eMMC), a reduced size MMC (RS-MMC), or micro-MMC type multimedia card, a secure digital (SD), mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-e or PCIe) type storage device, a compact flash (CF) card, a smart media card, and/or a memory stick.

The storage device 50 may be manufactured in the form of any one of various package types, such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory device 100 may store data therein. The memory device 100 may operate under control of the memory controller 200. The memory device 100 may include a memory cell array including a plurality of memory cells configured to store data therein. The memory cell array may include a plurality of memory blocks. Each memory block may include a plurality of memory cells. Each memory block may include a plurality of pages. In an embodiment, each page may be the unit of which data is stored in, or read from, the memory device 100. Each memory block may be the unit of erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change random access memory (PRAM), a magnetoresistive random access memory (MRAM), a ferroelectric random access memory (FRAM), or a spin transfer torque random access memory (SU-RAM). In this specification, by way of example, it is assumed that the memory device 100 is a NAND flash memory.

The memory device 100 may receive a command and an address from the memory controller 200 and access a region of the memory cell array that is selected by the address. In other words, the memory device 100 may perform an operation corresponding to the command on the region selected by the address. For example, the memory device 100 may perform a write (or program) operation, a read operation, and an erase operation. During a program operation, the memory device 100 may program data to a region selected by an address. During a read operation, the memory device 100 may read data from a region selected by an address. During an erase operation, the memory device 100 may erase data from a region selected by an address.

In an embodiment, the memory device 100 may include a read operation processor 131 and a read retry table 132.

The read operation processor 131 may perform a read operation on a selected word line of a plurality of word lines included in the memory cell array under control of the memory controller 200.

Pass or fail of the read operation may be determined depending on whether an error correction decoding operation on data read using a read voltage has passed or failed. If the error correction decoding operation passes, the read operation may pass. If the error correction decoding operation fails, the read operation may fail.

Under control of the memory controller 200, the read operation processor 131 may perform a read retry operation on a selected word line on which a read operation has failed. The read retry operation may be an operation of reperforming a read operation while changing conditions pertaining to the read operation. The conditions pertaining to the read operation may include at least any one of a read voltage level and an application time of a voltage related to the read operation. The read retry operation may be repeatedly performed up to a maximum allowable number of tries, e.g., within a set count, until the read retry operation passes.

In an embodiment, as long as a read retry count is less than a read retry threshold count, the read operation processor 131 may repeatedly perform the read retry operation until the read retry operation passes up to a read retry threshold count. The read retry count may be the number of times the read operation has been repeatedly performed on a selected word line on which the read operation has failed. The read retry threshold count may be a maximum iteration count within which the read retry operations can be performed. The read retry threshold count may be set.

If the selected word line on which the read operation has failed is a set word line, the read operation processor 131 may perform an additional read retry operation. The set word line may be a specific type of word line that may include a vulnerable word line. The vulnerable word line may be a word line having high resistance due to the location or structural characteristics of the word line. The additional read retry operation may be an operation of reading the set word line while adjusting the read voltage level and the application time of the voltage pertaining to the read operation. The additional read retry operation may be performed even when the read retry count is greater than the read retry threshold count.

In an embodiment, the read operation processor 131 may perform the additional read retry operation if the read retry count is below a total threshold count even if the read retry count exceeds the read retry threshold count. The total threshold count is a sum of an additional read retry threshold count and the read retry threshold count. The additional read retry threshold count may be a set value representing the maximum iteration count within which the additional read retry operation can be performed.

The read operation processor 131 may repeatedly perform the additional read retry operation until the additional read retry operation passes up to the additional read retry threshold count. The total threshold count may represent the total or collective number of read retry operations and additional read retry operations that may be performed on the selected word line. In an embodiment, the additional read retry threshold count may be less than or equal to or more than the read retry threshold count.

The read retry table 132 may include read retry information. The read retry information may include information about a read voltage level to be used for a read retry operation. The read voltage level may be a set value obtained by predicting a change in threshold voltage distribution of memory cells included in a word line on which the read operation has failed.

The read retry table 132 may include additional read retry information. The additional read retry information may include information about a set word line, which may be a vulnerable word line. The additional read retry information may include information about both a read voltage level and an application time of voltages pertaining to the read operation to be used for an additional read retry operation. The application time of voltage refers to the time for which a particular voltage is applied in a read operation.

The memory controller 200 may control overall operations of the storage device 50.

When power is applied to the storage device 50, the memory controller 200 may execute firmware. In the case where the memory device 100 is a flash memory device, the memory controller 200 may execute firmware such as a flash translation layer (FTL) for controlling communication between the host 300 and the memory device 100.

In an embodiment, the memory controller 200 may receive data and a logical block address (LBA) from the host 300. Further, the memory controller 200 may translate the LBA into a physical block address (PBA) indicating addresses of memory cells to which data is to be stored, the memory cells being included in the memory device 100.

The memory controller 200 may control the memory device 100 to perform a program operation, a read operation, or an erase operation in response to a request from the host 300. During the program operation, the memory controller 200 may provide a program command, a PBA, and data to the memory device 100. During the read operation, the memory controller 200 may provide a read command and a PBA to the memory device 100. During the erase operation, the memory controller 200 may provide an erase command and a PBA to the memory device 100.

In an embodiment, the memory controller 200 may autonomously generate a program command, an address and data regardless of a request from the host 300, and transmit them to the memory device 100. For example, the memory controller 200 may provide a command, an address and data to the memory device 100 to perform background operations such as a program operation for wear leveling, and a program operation for garbage collection.

In an embodiment, the memory controller 200 may control at least two or more memory devices 100. In this case, the memory controller 200 may control the memory devices 100 according to an interleaving scheme so as to enhance the operating performance. The interleaving scheme may be an operating scheme of overlapping operating periods of at least two or more memory devices 100.

In an embodiment, the memory controller 200 may include a read operation controller 210 and a read retry table storage 220.

The read operation controller 210 may control the memory controller 100 to perform a read operation on a selected word line among a plurality of word lines included in the memory device 100. The read operation controller 210 may control the memory device 100 to perform a read retry operation on a selected word line on which a read operation has failed. The read retry operation may be an operation of reperforming a read operation while changing conditions pertaining to the read operation.

In detail, the read operation controller 210 may control the memory device 100 to repeatedly perform the read retry operation within the read retry threshold count until the read operation passes.

The read operation controller 210 may control the memory device 100 to perform an additional read retry operation if the selected word line on which the read operation has failed is a set word line. The additional read retry operation may be an operation of reading the set word line while adjusting a read voltage level and an application time of a voltage pertaining to the read operation. The set word line may include a vulnerable word line. The additional read retry operation may be performed even when the read retry count is greater than the read retry threshold count.

In an embodiment, the read operation controller 210 may control the memory device 100 to perform the additional read retry operation if the read retry count is within the additional read retry threshold count even if the read retry count exceeds the read retry threshold count. The additional read retry operation may be repeatedly performed until the additional read retry operation passes.

The read retry table storage 220 may receive read retry information and additional read retry information from the memory device 100 when power is supplied to the memory device 100. Further, the read retry table storage 220 may store the read retry information and the additional read retry information.

In detail, when power is supplied to the memory device 100, the read retry table storage 220 may receive the read retry information and the additional read retry information from the read retry table 132 of the memory device 100. Further, the read retry table storage 220 may store the read retry information and the additional read retry information.

The host 300 may communicate with the storage device 50 using at least one of various communication methods, such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
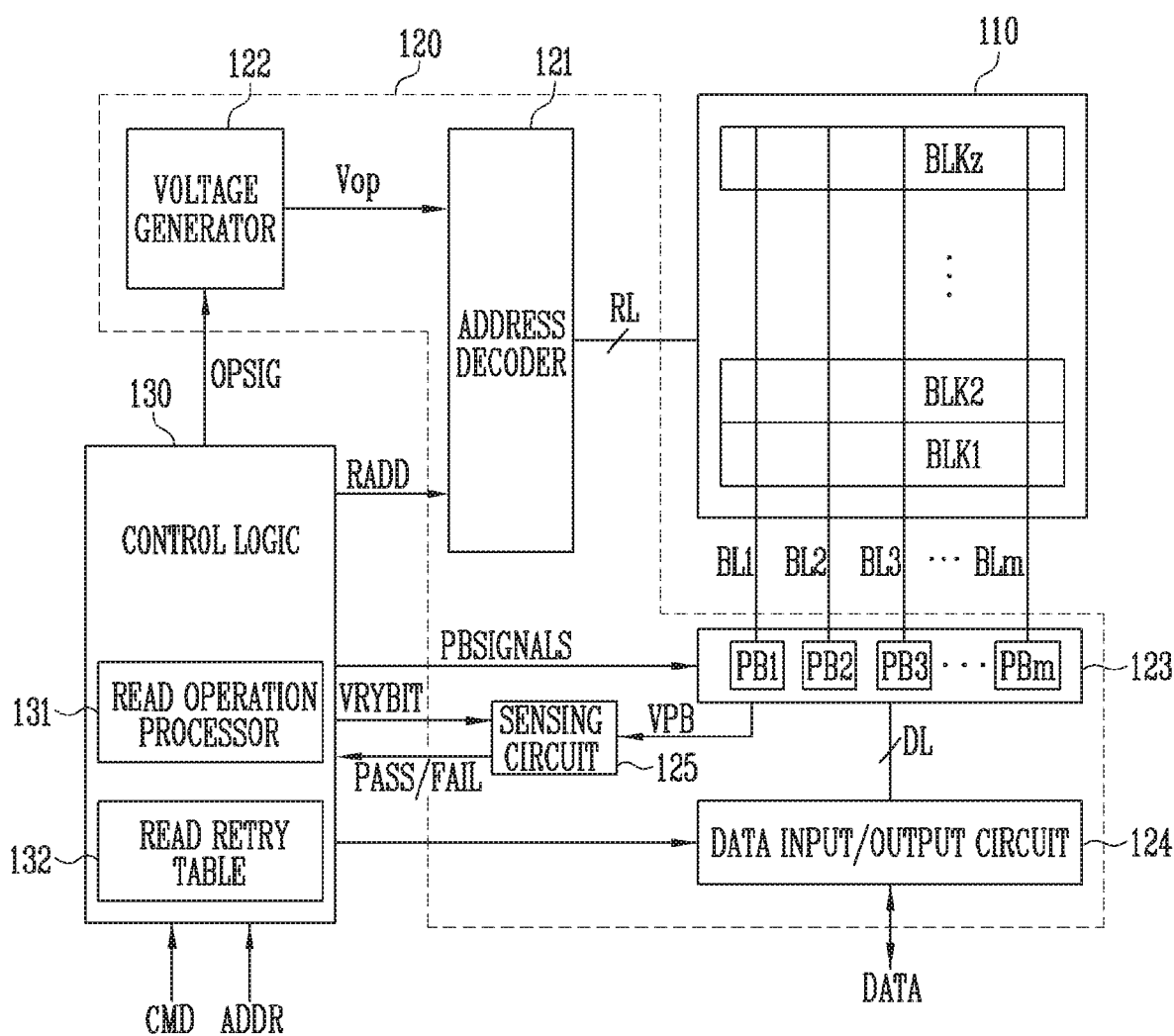
FIG. 2 is a diagram illustrating the configuration of a memory device, such as that of FIG. 1.

FIG. 2 is a diagram illustrating a configuration of the memory device 100 of FIG. 1 in accordance with an embodiment of the present disclosure.

Referring to FIG. 2, the memory device 100 may include a memory cell array 110, a peripheral circuit 120, and a control logic 130. The peripheral circuit 120 may include an address decoder 121, a voltage generator 122, a read and write (read/write) circuit 123, a data input and output (input/output) circuit 124, and a sensing circuit 125.

The memory cell array 110 may include a plurality of memory blocks BLK1 to BLKz. The plurality of memory blocks BLK1 to BLKz are coupled to the address decoder 121 through row lines RL. The memory blocks BLK1 to BLKz may be coupled to the read/write circuit 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line among the plurality of memory cells are defined as one page. In other words, the memory cell array 110 is formed of a plurality of pages. In an embodiment, each of the memory blocks BLK1 to BLKz included in the memory cell array 110 may include a plurality of dummy cells. Here, one or more dummy cells may be coupled in series between a drain select transistor and memory cells and between a source select transistor and the memory cells.

Each of the memory cells of the memory device 100 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may drive the memory cell array 110. For example, the peripheral circuit 120 may drive the memory cell array 110 to perform a program operation, a read operation, or an erase operation.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 may operate under control of the control logic 130. The address decoder 121 may receive addresses ADDR from the control logic 130.

The address decoder 121 may decode a block address among the received addresses ADDR. The address decoder 121 may select at least one of the memory blocks BLK1 to BLKz according to the decoded block address. The address decoder 121 may decode a row address RADD among the received addresses ADDR. The address decoder 121 may select at least one word line WL of the selected memory block by applying voltages supplied from the voltage generator 122 to at least one word line WL according to the decoded row address RADD.

During a program operation, the address decoder 121 may apply a program voltage to a selected word line and apply a pass voltage having a level less than that of the program voltage to unselected word lines. During a program verify operation, the address decoder 121 may apply a verify voltage to a selected word line and apply a verify pass voltage having a level greater than that of the verify voltage to unselected word lines.

During a read operation, the address decoder 121 may apply a read voltage to a selected word line and apply a read pass voltage having a level greater than that of the read voltage to unselected word lines.

In an embodiment, an erase operation of the memory device 100 may be performed on a memory block basis. During the erase operation, an address ADDR to be input to the memory device 100 includes a block address. The address decoder 121 may decode the block address and select a corresponding memory block according to the decoded block address. During the erase operation, the address decoder 121 may apply a ground voltage to word lines coupled to the selected memory block.

In an embodiment of the present disclosure, the address decoder 121 may decode a column address among the transmitted addresses ADDR. The decoded column address may be transmitted to the read/write circuit 123. For example, the address decoder 121 may include components such as a row decoder, a column decoder, and an address buffer.

The voltage generator 122 may generate a plurality of operating voltages Vop using an external supply voltage supplied to the memory device 100. The voltage generator 122 may operate under control of the control logic 130.

In an embodiment, the voltage generator 122 may generate an internal supply voltage by regulating the external supply voltage. The internal supply voltage generated from the voltage generator 122 may be used as an operating voltage of the memory device 100.

In an embodiment, the voltage generator 122 may generate a plurality of operating voltages Vop using an external supply voltage or an internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include, so as to generate a plurality of operating voltages Vop having various voltage levels, a plurality of pumping capacitors configured to receive an internal supply voltage. The voltage generator 122 may generate a plurality of operating voltages Vop by selectively enabling the plurality of pumping capacitors under control of the control logic 130.

The generated operating voltages Vop may be supplied to the memory cell array 110 by the address decoder 121.

The read/write circuit 123 may include first to m-th page buffers PB1 to PBm. The first to m-th page buffers PB1 to PBm may be coupled to the memory cell array 110 through the first to m-th bit lines BL1 to BLm, respectively. The first to m-th page buffers PB1 to PBm may operate under control of the control logic 130.

The first to m-th page buffers PB1 to PBm may communicate data with the data input/output circuit 124. During a program operation, the first to m-th page buffers PB1 to PBm may receive data to be stored through the data input/output circuit 124 and data lines DL.

During a program operation, the first to m-th page buffers PB1 to PBm may transmit the data DATA, received through the data input/output circuit 124, to selected memory cells through the bit lines BL1 to BLm when a program pulse is applied to a selected word line. The memory cells in the selected page are programmed based on the transmitted data DATA. Memory cells coupled to a bit line to which a program enable voltage (e.g., a ground voltage) is applied may have increased threshold voltages. Threshold voltages of memory cells coupled to a bit line to which a program inhibit voltage (for example, a supply voltage) is applied may be retained. During a program verify operation, the first to m-th page buffers PB1 to PBm may read data DATA from selected memory cells through the bit lines BL1 to BLm.

During a read operation, the read/write circuit 123 may read data DATA from the memory cells of the selected page through the bit lines BL, and store the read data to the first to m-th page buffers PB1 to PBm.

During an erase operation, the read/write circuit 123 may float the bit lines BL. In an embodiment, the read/write circuit 123 may include a column select circuit.

The data input/output circuit 124 is coupled to the first to m-th page buffers PB1 to PBm through the data lines DL. The data input/output circuit 124 may operate under control of the control logic 130.

The data input/output circuit 124 may include a plurality of input/output buffers (not shown) for receiving inputted data DATA. During a program operation, the data input/output circuit 124 may receive data DATA to be stored from an external controller (e.g., the memory controller 200 of FIG. 1). During a read operation, the data input/output circuit 124 may output, to the external controller, the data DATA received from the first to m-th page buffers PB1 to PBm of the read/write circuit 123.

During a read operation or a verify operation, the sensing circuit 125 may generate reference current in response to an enable bit (VRYBIT) signal generated by the control logic 130. Further, the sensing circuit 125 may compare a sensing voltage VPB received from the read/write circuit 123 with a reference voltage generated by the reference current, and output a pass signal or a fail signal to the control logic 130.

The control logic 130 may be coupled to the address decoder 121, the voltage generator 122, the read/write circuit 123, the data input/output circuit 124, and the sensing circuit 125. The control logic 130 may control the overall operations of the memory device 100. The control logic 130 may operate in response to a command CMD received from the external device.

The control circuit 130 may generate various signals in response to the command CMD and the address ADD and control the peripheral circuit 120. For example, the control logic 130 may generate an operating signal OPSIG, a row address RADD, a read/write circuit control signal PBSIGNALS, and an enable bit VRYBIT in response to the command CMD and the address ADD. The control logic 130 may output the operating signal OPSIG to the voltage generator 122, output the row address RADD to the address decoder 121, output the read/write control signal PBSIGNALS to the read/write circuit 123, and output the enable bit VRYBIT to the sensing circuit 125. Furthermore, the control logic 130 may determine whether target memory cells have passed or failed a verification during the verify operation in response to a pass signal PASS or a fail signal FAIL that is output from the sensing circuit 125.

In an embodiment, the control logic 130 may include the read operation processor 131 and the read retry table 132.

The read operation processor 131 may perform a read operation on a selected word line in response to a command CMD and an address ADD that are received from the memory controller 200.

In detail, the read operation processor 131 may change, in response to a set parameter received from the memory controller 200, conditions pertaining to the read operation on the selected word line on which the read operation has failed. Subsequently, in response to a read command received from the memory controller 200, the read operation processor 131 may perform the read operation on the selected word line with the changed conditions pertaining to the read operation. The conditions pertaining to the read operation may include at least any one of a read voltage level and an application time of a voltage related to the read operation. The read operation may be repeatedly performed within a set count until the read operation passes.

In an embodiment, if a read retry count is within the read retry threshold count, the read operation processor 131 may repeatedly perform a read retry operation until the read retry operation passes. The read retry operation may be an operation of reperforming the read operation while changing conditions pertaining to the read operation.

If the selected word line on which the read operation has failed is a set word line, the read operation processor 131 may perform an additional read retry operation. The additional read retry operation may be an operation of reading the set word line while adjusting the read voltage level and the application time of the voltage pertaining to the read operation. The set word line may include a vulnerable word line. The additional read retry operation may be performed even when the read retry count is greater than the read retry threshold count.

In an embodiment, the read operation processor 131 may perform the additional read retry operation if the read retry count is within the additional read retry threshold count even if the read retry count exceeds the read retry threshold count. The read operation processor 131 may repeatedly perform the additional read retry operation until the additional read retry operation passes.

The read retry table 132 may include read retry information. The read retry information may include information about a read voltage level needed to re-read the selected word line on which the read operation has failed. The read voltage level may be a set value obtained by predicting a change in threshold voltage distribution of memory cells included in a word line on which the read operation has failed. The change in the threshold voltage distribution may result from a variety of factors such as degradation of a memory cell, interference effect between adjacent memory cells, read disturbance, and program disturbance.

The read retry table 132 may include additional read retry information. The additional read retry information may include information about a set word line. The additional read retry information may include information both about a read voltage level needed to re-read the set word line on which the read operation has failed and about an application time of a voltage pertaining to the read operation. The set word line may include a vulnerable word line.

Alternatively, the read retry table 132 may be stored in a memory block which stores information about the operation of the memory device 100.

Figure 3:
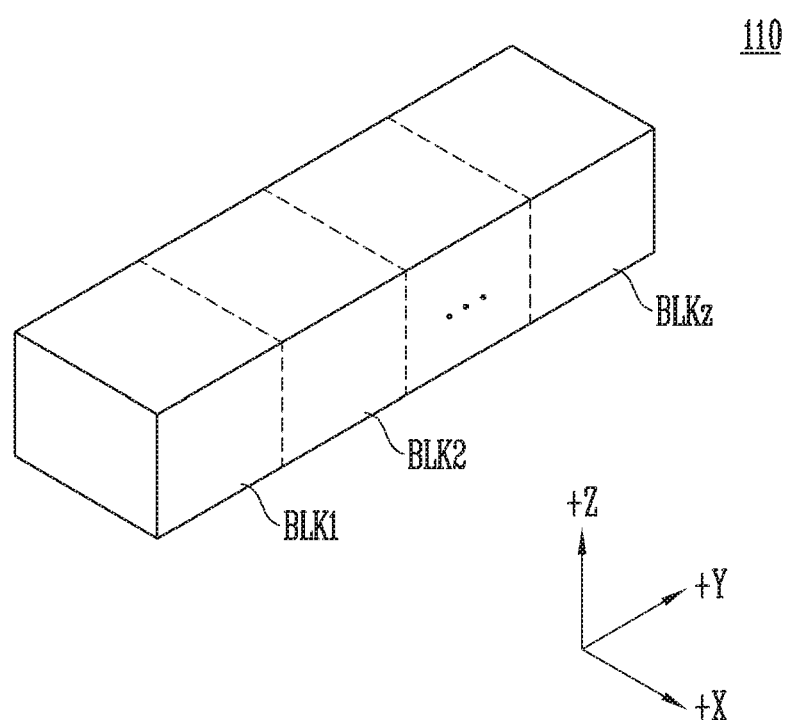
FIG. 3 is a diagram illustrating an embodiment of a memory cell array of FIG. 2.

FIG. 3 is a diagram illustrating a memory cell array, e.g., the memory cell array 110 of FIG. 2, in accordance with an embodiment of the present disclosure.

Referring to FIG. 3, the memory cell array 110 may include a plurality of memory blocks BLK1 to BLKz. Each memory block has a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 4 and 5.

Figure 4:
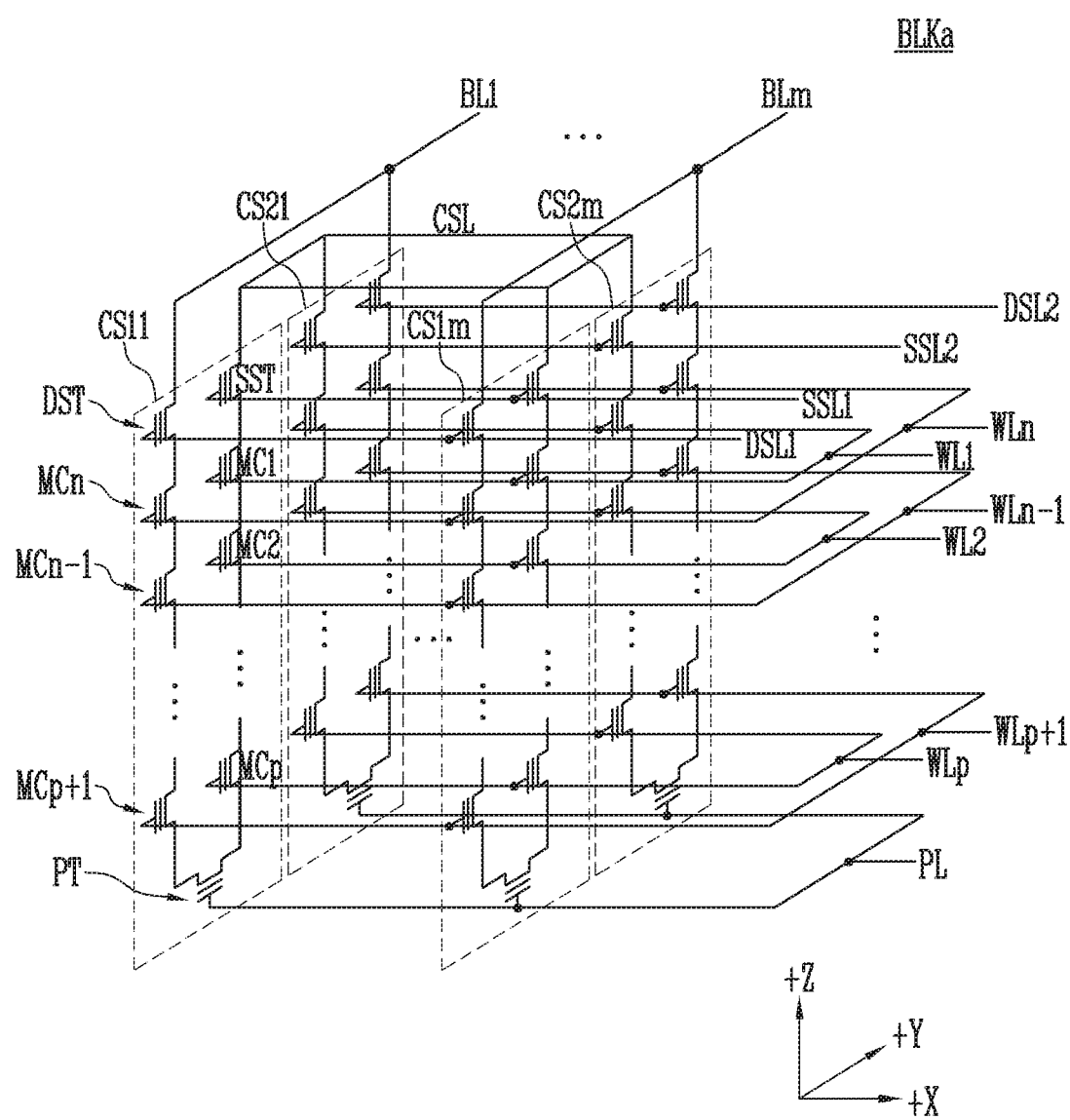
FIG. 4 is a circuit diagram illustrating a representative memory block BLKa of memory blocks BLK1 to BLKz of FIG. 3, in accordance with an embodiment of the present disclosure.

FIG. 4 is a circuit diagram illustrating a representative memory block BLKa of memory blocks BLK1 to BLKz of FIG. 3, in accordance with an embodiment of the present disclosure.

Referring to FIG. 4, the memory block BLKa may include a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings may be arranged in a row direction (i.e., the +X direction). Although FIG. 4 illustrates two cell strings are arranged in a column direction (i.e., the +Y direction), it will be understood that three or more cell strings may be arranged in the column direction.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 4, source select transistors of the cell strings CS11 to CS1m in a first row are coupled to a first source select line SSL1. Source select transistors of the cell strings CS21 to CS2m in a second row are coupled to a second source select line SSL2.

In an embodiment, the source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are successively arranged in a direction opposite to the +Z direction and are coupled in series between the source select transistor SST and the pipe transistor PT. The (p+1)-th to n-th memory cells MCp+1 to MCn are successively arranged in the +Z direction and are coupled in series between the pipe transistor PT and the drain select transistor DST. The first to p-th memory cells MC1 to MCp and the (p+1)-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 4, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1$m$ in the first row, form a single page. Memory cells coupled to the first word line WL1, among the cell strings CS21 to CS2$m$ in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-numbered cell strings of the cell strings CS11 to CS1$m$ or CS21 to CS2$m$ arranged in the row direction may be coupled to the respective even bit lines. Odd-numbered cell strings of the cell strings CS11 to CS1$m$ or CS21 to CS2$m$ arranged in the row direction may be coupled to the respective odd bit lines.

In an embodiment, at least one of the first to n-th memory cells MC1 to MCn may be used as a dummy memory cell. For example, dummy memory cell(s) may be provided to reduce an electric field between the source select transistor SST and the memory cells MC1 to MCp. Alternatively, dummy memory cell(s) may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the dummy memory cell(s), each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 5:
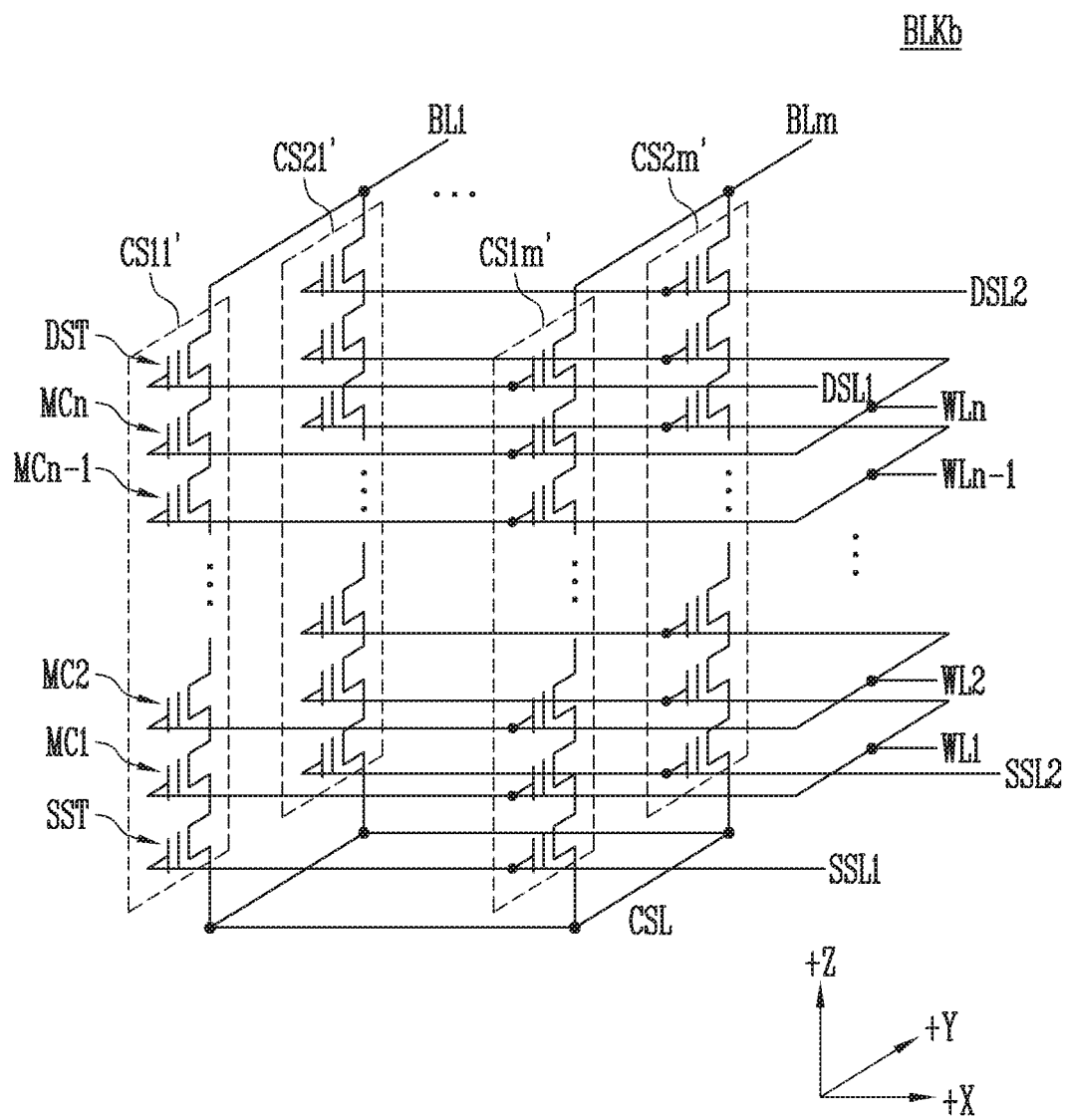
FIG. 5 is a circuit diagram illustrating a representative memory block BLKb of the memory blocks BLK1 to BLKz of FIG. 3, in accordance with an embodiment of the present disclosure.

FIG. 5 is a circuit diagram illustrating a representative memory block BLKb of the memory blocks BLK1 to BLKz of FIG. 3, in accordance with an embodiment of the present disclosure.

Referring to FIG. 5, the memory block BLKb may include a plurality of cell strings CS11' to CS1$m$' and CS21' to CS2$m$'. Each of the cell strings CS11' to CS1$m$' and CS21' to CS2$m$' extends in the +Z direction. Each of the cell strings CS11' to CS1$m$' and CS21' to CS2$m$' may include at least one source select transistor SST, first to n-th memory cells MC1 to MCn, and at least one drain select transistor DST which are stacked on a substrate (not shown) provided in a lower portion of the memory block BLKb.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1$m$' arranged in a first row may be coupled to a first source select line SSL1. Source select transistors of the cell strings CS21' to CS2$m$' arranged in a second row may be coupled to a second source select line SSL2. In an embodiment, source select transistors of the cell strings CS11' to CS1$m$' and CS21' to CS2$m$' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1$m$' in the first row are coupled to a first drain select line DSL1. Drain select transistors of the cell strings CS21' to CS2$m$' in the second row may be coupled to a second drain select line DSL2.

Consequentially, the memory block BLKb of FIG. 5 may have an equivalent circuit similar to that of the memory block BLKa of FIG. 4 except that a pipe transistor PT is excluded from each cell string.

In an embodiment, even bit lines and odd bit lines may be provided in lieu of the first to m-th bit lines BL1 to BLm. Even-numbered cell strings among the cell strings CS11' to CS1$m$' or CS21' to CS2$m$' arranged in the row direction may be coupled to the respective even bit lines, and odd-numbered cell strings among the cell strings CS11' to CS1$m$' or CS21' to CS2$m$' arranged in the row direction may be coupled to the respective odd bit lines.

In an embodiment, at least one of the first to n-th memory cells MC1 to MCn may be used as a dummy memory cell. For example, dummy memory cell(s) may be provided to reduce an electric field between the source select transistor SST and the memory cells MC1 to MCn. Alternatively, dummy memory cell(s) may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the dummy memory cell(s), each of the dummy memory cells may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 6:
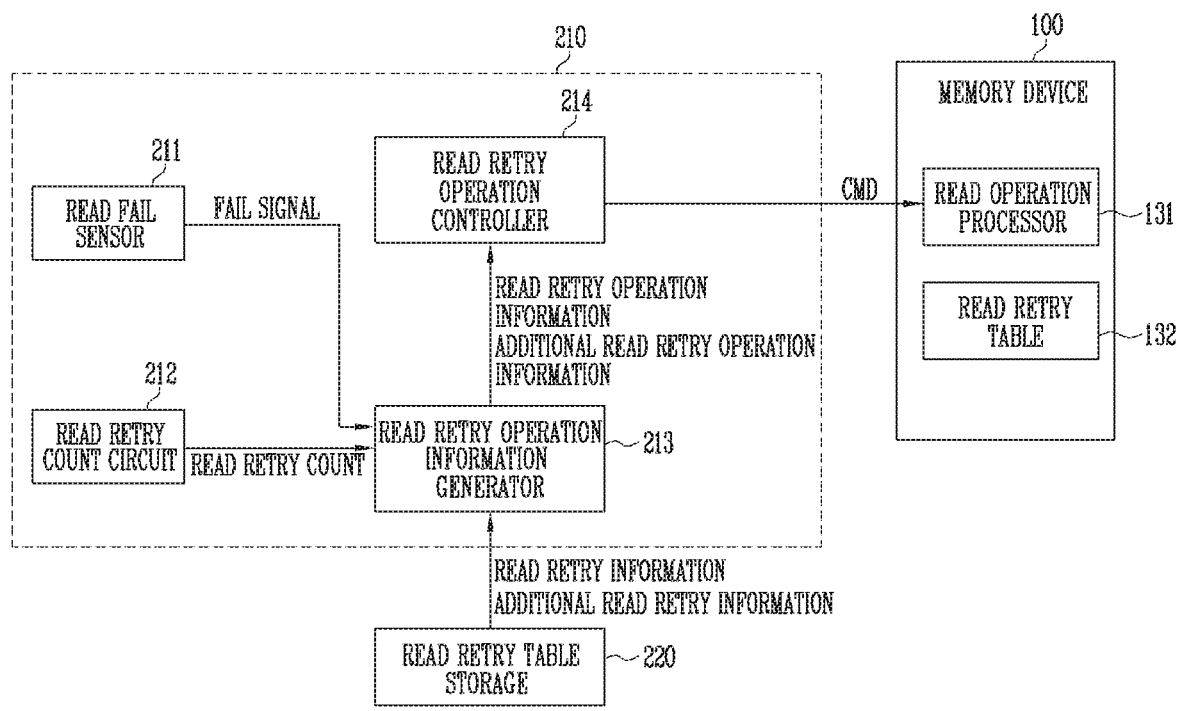
FIG. 6 is a diagram illustrating an operation between a memory controller and a memory device in accordance with an embodiment of the present disclosure.

FIG. 6 is a diagram illustrating an operation between a memory controller, e.g., the memory controller 200, and a memory device, e.g., the memory device 100, in accordance with an embodiment of the present disclosure.

Referring to FIG. 6, the memory device 100 may include the read operation processor 131 and the read retry table 132. The memory controller 200 may include the read operation controller 210 and the read retry table storage 220.

The read operation processor 131 may perform a read operation on a selected word line of a plurality of word lines included in the memory cell array under control of the memory controller 200.

For example, the read operation processor 131 may change, in response to a set parameter provided from the read retry operation controller 214, conditions pertaining to the read operation on the selected word line on which the read operation has failed. The conditions pertaining to the read operation may include at least one of a read voltage level and a time for which a voltage related to the read operation is applied, i.e., application time of voltage. Subsequently, in response to a read command provided from the read retry operation controller 214, the read operation processor 131 may reperform the read operation on the selected word line with the changed conditions pertaining to the read operation.

The read retry table 132 may include read retry information. The read retry information may include information both about a read voltage level to be used for a read retry operation, and about a read retry threshold count.

The read retry table 132 may include additional read retry information. The additional read retry information may include information about a set word line and information about an additional read retry threshold count. The additional read retry threshold count may be a set value as the maximum iteration count within which the additional read retry operation can be performed, The additional read retry information may include information about both a read voltage level and an application time of a voltage pertaining to the read operation, to be used for an additional read retry operation. The set word line may include a vulnerable word line.

In an embodiment, the read operation controller 210 may include a read fail sensor 211, a read retry count circuit 212, a read retry operation information generator 213, and a read retry operation controller 214.

The read operation controller 210 may control the read operation processor 131 to perform a read operation on a selected word line of the plurality of word lines included in the memory cell array.

The read fail sensor 211 may sense whether the read operation performed by the read operation processor 131 has failed. Here, the read operation may include a read retry operation or an additional read retry operation.

The read fail sensor 211 may sense whether the read operation has passed or failed depending on whether an error correction decoding operation on data read using a read voltage has passed or failed. If the error correction decoding operation passes, the read operation may pass. If the error correction decoding operation fails, the read operation may fail. In an embodiment, the memory controller 200 may include an error correction code (ECC) decoder configured to perform an error correction decoding operation.

Pass or fail of the error correction decoding operation may be determined depending on a result of comparing the number of error bits in the data read using the read voltage with the number of error bits which may be corrected by the ECC decoder (correctable error bits). If the number of error bits in the read data is less than or equal to the number of correctable error bits, the error correction decoding operation may pass. If the number of error bits in the read data exceeds the number of correctable error bits, the error correction decoding operation may fail.

The read fail sensor 211 may generate a fail signal when failure of the read operation, the read retry operation, or the additional read retry operation is sensed. Further, the read fail sensor 211 may provide the fail signal to the read retry operation information generator 213.

The read retry count circuit 212 may count read retry operations. The read retry count may be the number of times the read operation processor 131 has re-performed the read operation on the selected word line, on which the read operation has failed, while changing conditions pertaining to the read operation. The conditions pertaining to the read operation may include at least any one of a read voltage level and an application time of a voltage related to the read operation.

The read retry count circuit 212 may provide the counted read retry count to the read retry operation information generator 213.

The read retry operation information generator 213 may generate information needed to read the selected word line on which the read operation has failed. Further, the read retry operation information generator 213 may provide the generated information to the read retry operation controller 214.

In an embodiment, if a fail signal is received, the read retry operation information generator 213 may generate read retry operation information using the read retry information stored in the read retry table storage 220 depending on the read retry count. The read retry operation information may be information needed for the read retry operation controller 214 to control the read operation processor 131 such that the read operation processor 131 performs the read retry operation.

For example, when a fail signal is received, the read retry operation information generator 213 may compare the read retry count with the read retry threshold count and generate read retry operation information. The read retry operation information generator 213 may generate the read retry operation information if the read retry count is within the read retry threshold count.

In an embodiment, when a fail signal is received, the read retry operation information generator 213 may generate additional read retry operation information using the additional read retry information stored in the read retry table storage 220 depending on the read retry count. The additional read retry operation information may be information needed for the read retry operation controller 214 to control the read operation processor 131 such that the read operation processor 131 performs an additional read retry operation.

For example, when the fail signal is received and the read retry count is greater than the read retry threshold count, the read retry operation information generator 213 may determine whether the selected word line on which the read operation has failed corresponds to a set word line. If the selected word line is the set word line and the read retry count is less than or equal to a total threshold count, the read retry operation information generator 213 may generate additional read retry operation information. The total threshold count is a sum of the read retry threshold count and the additional read retry threshold count.

The read retry operation controller 214 may generate control commands for a read retry operation or an additional read retry operation according to the fail signal and a read retry count. The read retry operation controller 214 may generate, based on the generated read retry operation information, a control command for instructing the read operation processor 131 to perform the read retry operation. Specifically, the read retry operation controller 214 may generate the control command for the read retry operation, according to a result of comparing the read retry count with a read retry threshold count. Further, the read retry operation controller 214 may provide the control command to the read operation processor 131.

The read retry operation controller 214 may generate, based on the generated additional read retry operation information, a control command for instructing the read operation processor 131 to perform the additional read retry operation. Specifically, the read retry operation controller 214 may generate the control command for the additional read retry operation, according to a result of comparing the read retry count with a total threshold count. Further, the read retry operation controller 214 may provide the control command to the read operation processor 131.

The read retry operation controller 214 may provide a control command including a read command or a set parameter command to the read operation processor 131. In detail, the read retry operation controller 214 may set a read voltage level or an application time of voltages related to the read operation using the set parameter command. Thereafter, the read retry operation controller 214 may instruct, using the read command, the read operation processor 131 to perform the read operation on the selected word line.

Figure 7:
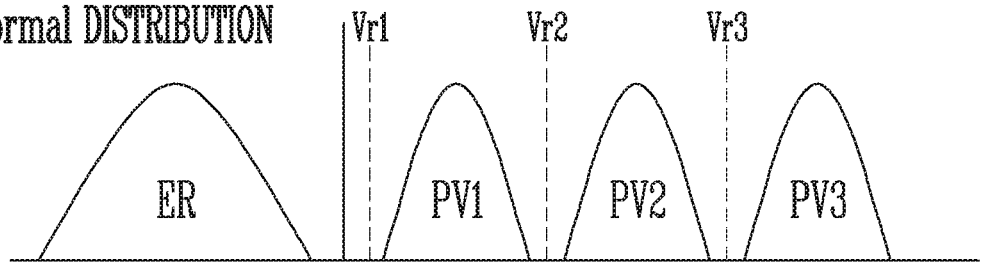
FIG. 7 is a diagram illustrating an example in which a read voltage level is adjusted during a read retry operation in accordance with an embodiment of the present disclosure.
Figure 7:
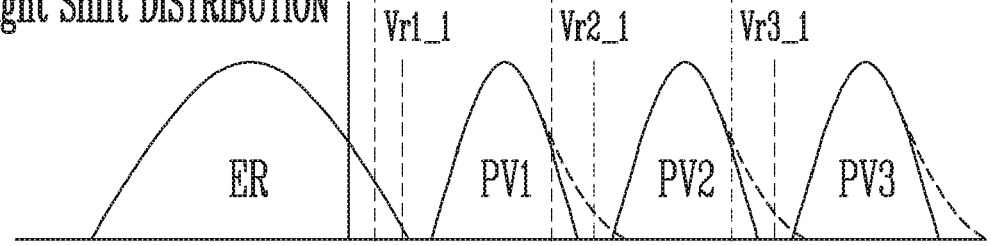
Figure 7:
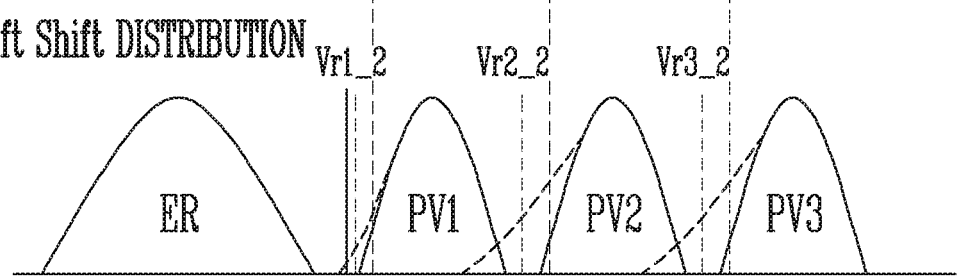

FIG. 7 is a diagram illustrating an example in which the read voltage level is adjusted during a read retry operation in accordance with an embodiment of the present disclosure.

Referring to FIG. 7, a memory cell refers to a multi-level cell (MLC) capable of storing two bits of data in each memory cell. The multi-level cell may have any one state among an erased state ER and first to third programmed states PV1 to PV3.

Graph (a) represents a multi-level cell having a normal threshold voltage distribution. In the multi-level cell having the normal threshold voltage distribution, a sufficient read margin may be secured between threshold voltage distributions corresponding to the respective states. The read margin may be a distance between threshold voltage distributions in which read voltages may be disposed to identify adjacent states from each other.

In graph (a), first to third default read voltages Vr1 to Vr3 may be for distinguishing the erase state ER and the first to third program states PV1 to PV3 from each other. The first default read voltage Vr1 may distinguish the erase state ER and the first program state PV1 from each other. The second default read voltage Vr2 may distinguish the first program state PV1 and the second program state PV2 from each other. The third default read voltage Vr3 may distinguish the second program state PV2 and the third program state PV3 from each other.

Graph (b) illustrates the case where a right edge of a threshold distribution of a multi-level cell is shifted to the right, which may be caused by any of various factors such as program disturbance and read disturbance, compared to that of the normal threshold voltage distribution. In this case, a sufficient read margin may not be secured between the threshold voltage distributions corresponding to the respective states.

In the case where multi-level cells are read using the first to third default read voltages Vr1 to Vr3 described with reference to graph (a), the number of error bits in the read data is increased, so that the probability of failure of a read operation may be increased.

Pass or fail of the read operation may be determined depending on whether an error correction decoding operation on data read using a read voltage has passed or failed. If the error correction decoding operation passes, the read operation may pass. If the error correction decoding operation fails, the read operation may fail.

Pass or fail of the error correction decoding operation may be determined depending on a result of comparing the number of error bits in the data read using the read voltage with the number of error bits which may be corrected by the ECC decoder (correctable error bits). If the number of error bits in the read data is less than or equal to the number of correctable error bits, the error correction decoding operation may pass. If the number of error bits in the read data exceeds the number of correctable error bits, the error correction decoding operation may fail.

The number of error bits represents the number of memory cells that are incorrectly read as off-cells when they should be read as on-cells or are incorrectly read as on-cells when they should be read as off-cells depending on programmed states of the memory cells. The number of correctable error bits represents the number of error bits that may be restored to their original values, i.e., corrected, by the error decoder.

To reduce the probability of failure of the read operation, the levels of read voltages for reading the multi-level cells may be adjusted by offset voltages based on the default read voltages. The offset voltages may be voltage values which are added to or subtracted from the read voltages so as to change the read voltages due to various reasons.

In an embodiment, first to third read voltages Vr1_1 to Vr3_1 may be adjusted by positive offset voltages based on the first to third default read voltages Vr1 to Vr3 described with reference to graph (a).

In the case where the memory cells having threshold voltage distributions of which the right edges have been shifted to the right compared to that of the normal threshold voltage distributions are read using the first to third read voltages Vr1_1 to Vr3_1, the number of error bits may be reduced, whereby the probability of failure of a read operation may be reduced.

Graph (c) illustrates the case where a left edge of a threshold distribution of a multi-level cell is shifted to the left by any of various factors such as degradation of memory cells, compared to that of the normal threshold voltage distribution. In this case, a sufficient read margin may not be secured between the threshold voltage distributions corresponding to the respective states.

In the case where multi-level cells are read using the first to third default read voltages Vr1 to Vr3 described with reference to graph (a), the number of error bits included in the read data is increase, so that the probability of failure of a read operation may be increased.

In an embodiment, first to third read voltages Vr1_2 to Vr3_2 may be adjusted by negative offset voltages based on the first to third default read voltages Vr1 to Vr3 described with reference to graph (a).

In the case where the memory cells having threshold voltage distributions of which the left edges have been shifted to the left compared to that of the normal threshold voltage distributions are read using the first to third read voltages Vr1_2 to Vr3_2, the number of error bits may be reduced, whereby the probability of failure of a read operation may be reduced.

Figure 8:
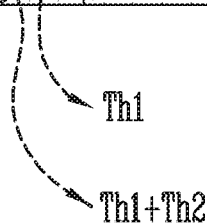
FIG. 8 is a diagram illustrating a read retry table in accordance with an embodiment of the present disclosure.

FIG. 8 is a diagram illustrating a read retry table in accordance with an embodiment of the present disclosure.

Referring to FIG. 8, each of memory cells coupled to a word line on which a read operation has failed may be a multi-level cell capable of storing two bits of data. In various embodiments, as shown in FIG. 7, the multi-level cell may have any one state among an erased state ER and first to third programmed states PV1 to PV3. First to third default read voltages Vr1 to Vr3 may be default read voltages for distinguishing adjacent states (among the erase and first to third program states) from each other. However, the number of data bits to be stored in each memory cell, and the number of default read voltages for respective pairs of adjacent states from each other are not limited to those of the present embodiment. Memory cells that store more than two bits of data have more than four possible states, as well as more default read voltages for distinguishing pair of adjacent states. Aspects of the present invention are also applicable to such higher storage capacity memory cells.

The read retry table may include, for each read retry count (Read Retry Count) for word lines (Read Retry WLs) on which read retry operations are performed, information about read voltage levels (Read Retry Level Sets) which are used in a read operation, and information about a voltage application time (Read Timing Info) pertaining to the read operation. The read retry count (Read Retry Count) may be the number of times a read operation has been re-performed on a word line on which the read operation has failed.

A read retry operation on normal word lines (Normal WLs) and set word lines (Preset WLs) may iteratively performed within a read retry threshold count Th1 until the read retry operation passes. The read retry threshold count Th1 may be a set value representing the maximum iteration count within which the read retry operations can be performed while changing the read voltage level. Although FIG. 8 illustrates the case where the read retry threshold count Th1 is 5, the read retry threshold count Th1 is not limited to 5; other suitable read retry threshold counts may be used.

The read voltage level sets (Read Level Sets) may be read voltages adjusted by offset voltages based on the default read voltages so as to read word lines (Normal WLs and Preset WLs) on which the read operation has failed. The offset voltages, which may be predetermined, may be added to or subtracted from the read voltages so as to change the read voltages due to various reasons.

During a first read retry operation, read voltages $Vr1\_1$ to $Vr3\_1$ may be adjusted by offset voltages based on first to third default read voltages $Vr1$ to $Vr3$ for reading multi-level cells. During a second read retry operation, read voltages $Vr1\_2$ to $Vr3\_2$ may be adjusted by offset voltages based on the first to third default read voltages $Vr1$ to $Vr3$ for reading multi-level cells. Likewise, during a fifth read retry operation, read voltages $Vr1\_5$ to $Vr3\_5$ may also be adjusted by offset voltages based on the first to third default read voltages $Vr1$ to $Vr3$.

The offset voltages are applied to the read voltages used during each read retry operation. The offset voltages may have different values.

If the read retry count exceeds the read retry threshold count Th1, additional read retry operations may be performed on only the set word lines (Preset WLs). The set word lines may include vulnerable word lines. The vulnerable word lines may be word lines having high resistance due to the location or structural characteristics of the word lines.

The additional read retry threshold count Th2 may be a set value representing the maximum iteration count within which the additional read retry operation can be performed on a set word line WL while changing conditions pertaining to the read operation. In the present embodiment, the additional read retry threshold count Th2 is 3 and the total threshold count (Th1+Th2) is 8. The additional read retry threshold count Th2 is not limited to 3; any suitable value for Th2 may be used.

The additional read retry operation may be performed on only set word lines on which the read operation has failed. The additional read retry operation may be repeatedly performed until the additional read retry operation passes. The additional read retry operation may be performed when the read retry count is greater than the read retry threshold count Th1 and is less than the total threshold count (Th1+Th2). The additional read retry operation may be an operation of reading the set word lines while adjusting the read voltage level sets and the application time of a voltage pertaining to the read operation. Such application time of voltage, i.e., time for which such voltage is applied in the read operation, may be different for different read retry counts. That is, Timeinfo_1, Timeinfo_2 and Timeinfo_3, which are the application times for the voltages associated with read retry counts 6, 7 and 8 respectively, may be different from each other.

For example, if the read retry count is 6, an additional read retry operation of reading the set word lines on which the read operation has failed may be performed using the first to third read voltages $Vr1\_6$ to $Vr3\_6$ determined depending on the read retry count and using the voltage application time Timeinfo_1 pertaining to a first read operation. Likewise, if the read retry count is within a range of 8 that is the total threshold count (Th1+Th2), the additional read retry operation may be repeatedly performed until the additional read retry operation passes.

If word lines on which the read operation has failed correspond to the normal word lines, the read retry operation may be repeatedly performed within a range of the read retry threshold count. Thereafter, another data recovery algorithm may be performed.

If word lines on which the read operation has failed correspond to the set word lines, the read retry operation may be repeatedly performed within a range of the read retry threshold count. Thereafter, an additional read retry operation may be performed until the read retry count reaches a total threshold count. If the read retry count exceeds the total threshold count, another data recovery algorithm may be performed on the set word lines.

Figure 9:
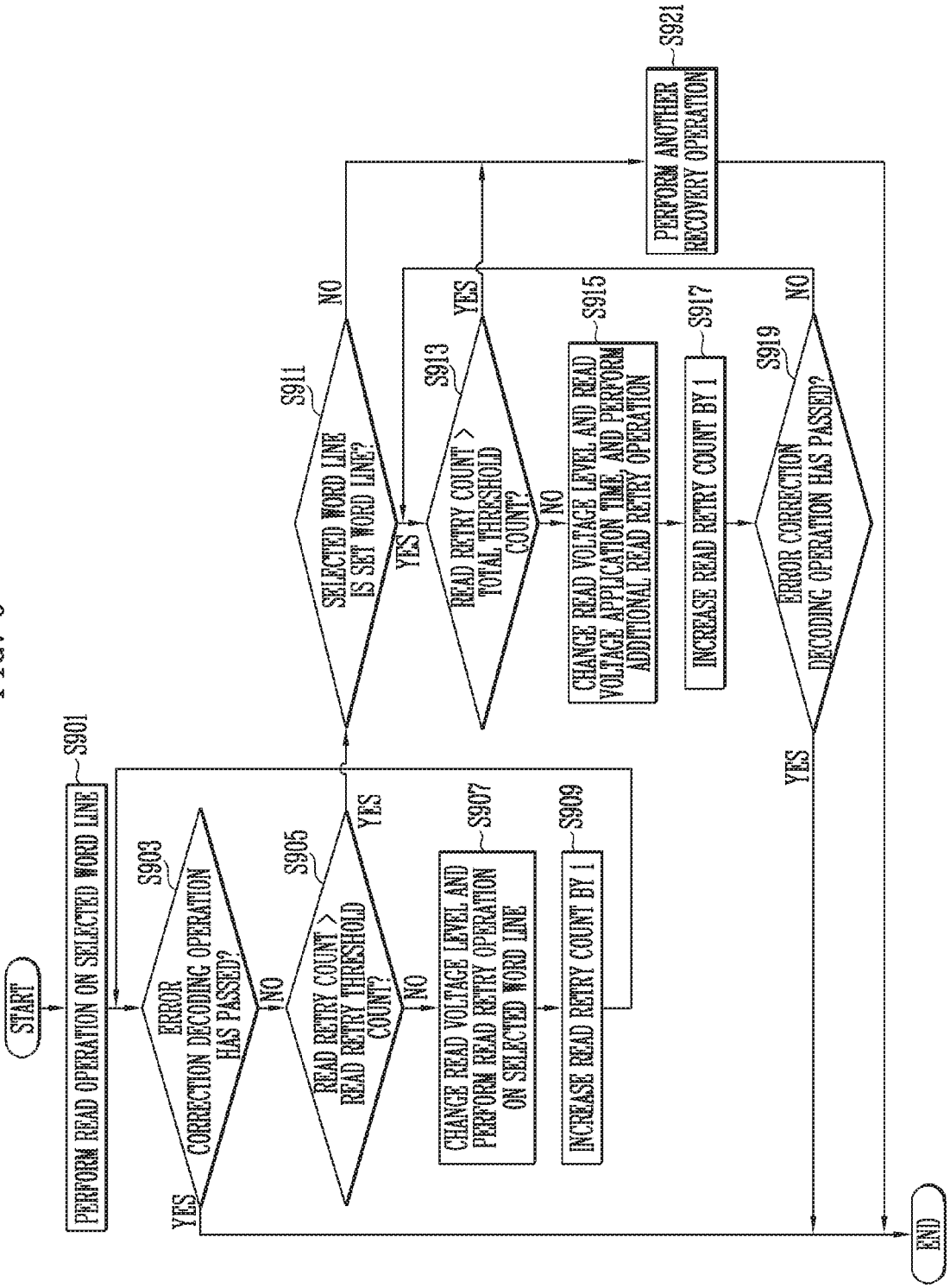
FIG. 9 is a flowchart illustrating an operation of a storage device in accordance with an embodiment of the present disclosure.

FIG. 9 is a flowchart illustrating an operation of a storage device in accordance with an embodiment of the present disclosure. The operation of FIG. 9 may be performed by the storage device 50 including the memory device 100 and the memory controller 200 in FIG. 1.

Referring to FIG. 9, at step S901, the storage device 50 may perform, using a default read voltage, a read operation on a selected word line among a plurality of word lines included in the memory device 100.

At step S903, the storage device 50 may determine whether an error correction decoding operation for the read operation has passed. If it is determined that the error correction decoding operation has passed (S903, YES), the process is terminated. If not (S903, NO), the process proceeds to step S905.

If the number of error bits in data read using the read voltage is less than or equal to the number of error bits which may be corrected by the ECC decoder (correctable error bits), the error correction decoding operation may pass. If the number of error bits in the data read using the read voltage exceeds the number of correctable error bits, the error correction decoding operation may fail.

At step S905, the storage device 50 may determine whether the read retry count is greater than the read retry threshold count. If it is determined that the read retry count is greater than the read retry threshold count (S905, YES), the process proceeds to step S911. If not (S905, NO), the process proceeds to step S907. The read retry count may represent the number of times the read operation has been repeatedly performed on the selected word line on which the read operation has failed.

At step S907, after the read voltage level has been adjusted based on the read retry table, the read operation may be performed again on the selected word line on which the read operation has failed. The read retry table may include information about a read voltage level to be used during a read operation depending on a read retry count.

At step S909, the storage device 50 may increase the read retry count by 1. The process then returns to step S903 where it is determined whether an error correction decoding operation for the read retry operation performed in step S907 has passed. Steps S903, S905, S907 and S909 are repeated until it is determined at step 905 that the read retry count is greater than the read retry threshold count, in which case the process proceeds to step S911.

At step S911, the storage device 50 may determine whether the selected word line is a set word line. If it is determined that the selected word line is a set word line (S911, YES), the process proceeds to S913. If not (S911, NO), the process proceeds to step S921. The set word line, e.g., specific type of word line, may include a vulnerable word line.

At step S913, the storage device 50 may determine whether the read retry count is greater than the total threshold count. If it is determined that the read retry count is greater than the total threshold count (S913, YES), the process proceeds to step S921. If not (S913, NO), the process proceeds to step S915.

At step S915, the storage device 50 may adjust the read voltage level and the voltage application time related to the read operation based on the read retry table. Further, the storage device 50 may perform the read operation on the selected word line on which the read operation has failed. The read retry table may include information about a read voltage level to be used during the read operation depending on a read retry count, and information about a voltage application time related to the read operation.

At step S917, the storage device 50 may increase the read retry count by 1.

At step S919, the storage device 50 may determine whether an error correction decoding operation for the read operation has passed. If it is determined that the error correction decoding operation has passed (S919, YES), the process is terminated. If not (S919, NO), the process proceeds to step S913.

At step S921, the storage device 50 may perform another data recovery algorithm on the selected word line.

Figure 10:
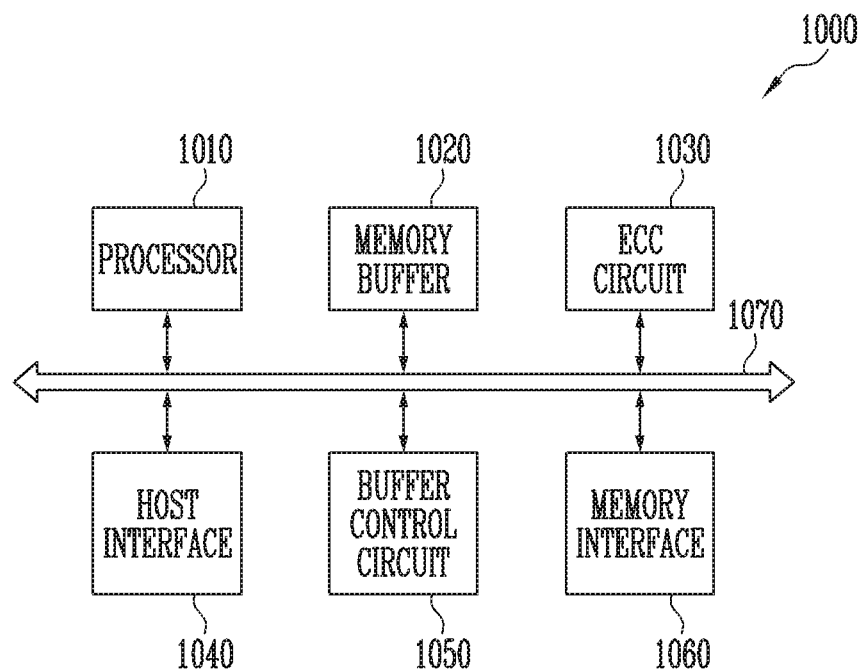
FIG. 10 is a diagram illustrating a memory controller in accordance with an embodiment of the present disclosure.

FIG. 10 is a diagram illustrating an embodiment of a memory controller 1000, which may be configured the same or similarly to the memory controller 200 of FIG. 1.

Referring to FIG. 10, a memory controller 1000 is coupled to a host (e.g., the host 300 of FIG. 1) and a memory device (e.g., the memory device 100 of FIG. 1). In response to a request from the host 300, the memory controller 1000 may access the memory device 100. For example, the memory controller 1000 may control a write operation, a read operation, an erase operation, and a background operation of the memory device 100. The memory controller 1000 may provide an interface between the memory device 100 and the host 300. The memory controller 1000 may drive firmware for controlling the memory device 100.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the host 300 through the host interface 1040, and communicate with the memory device 100 through the memory interface 1060. In addition, the processor 1010 may communicate with the memory buffer 1020 through the buffer control circuit 1050.

The processor 1010 may control the operation of the storage device 50 using the memory buffer 1020 as an operating memory, a cache memory, or a buffer memory.

The processor 1010 may perform the function of a flash translation layer (FTL). The processor 1010 may translate a logical block address (LBA), provided by the host 300, into a physical block address (PBA) through the FTL. The FTL may receive the LBA and translate the LBA into the PBA using a mapping table. An address mapping method using the FTL may be modified in various ways depending on the unit of mapping. Representative address mapping methods may include a page mapping method, a block mapping method, and a hybrid mapping method.

The processor 1010 may randomize data received from the host 300. For example, the processor 1010 may use a randomizing seed to randomize data received from the host 300. Randomized data may be provided to the memory device 100 as data to be stored, and may be programmed to a memory cell array (e.g., the memory cell array 110 of FIG. 2).

During a read operation, the processor 1010 may derandomize data received from the memory device 100. For example, the processor 1010 may use a derandomizing seed to derandomize data received from the memory device 100. Derandomized data may be output to the host 300.

In an embodiment, the processor 1010 may drive software or firmware to perform the randomizing operation or the derandomizing operation.

The memory buffer 1020 may be used as an operating memory, a cache memory, or a buffer memory of the processor 1010. The memory buffer 1020 may store codes and commands to be executed by the processor 1010. The memory buffer 1020 may store data to be processed by the processor 1010. The memory buffer 1020 may include a static random access memory (RAM) (SRAM) or a dynamic RAM (DRAM).

The ECC circuit 1030 may perform error correction. The ECC circuit 1030 may perform an ECC encoding operation based on data to be written to the memory device 100 through the memory interface 1060. ECC encoded data may be transmitted to the memory device 100 through the memory interface 1060. The ECC circuit 1030 may perform an ECC decoding operation on data received from the memory device 100 through the memory interface 1060. For example, the ECC circuit 1030 may be included in the memory interface 1060 as a component of the memory interface 1060.

The host interface 1040 may communicate with the host 300 under control of the processor 1010. The host interface 1040 may perform communication using at least one of various communication methods, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and a load reduced DIMM (LRDIMM) communication methods.

The buffer control circuit 1050 may control the memory buffer 1020 under control of the processor 1010.

The memory interface 1060 may communicate with the memory device 100 under control of the processor 1010. The memory interface 1060 may communicate a command, an address, and data with the memory device through the channel.

In an embodiment, the memory controller 1000 may include neither the memory buffer 1020 nor the buffer control circuit 1050. Either of these components may be provided separately or one or both of their functions may be distributed within the memory controller 1000.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device 100 through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other so as not to interfere nor affect each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 11:
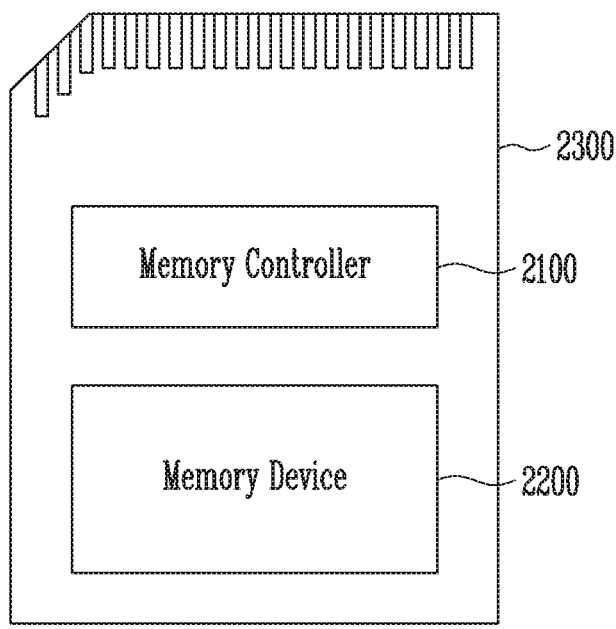
FIG. 11 is a block diagram illustrating a memory card system to which the storage device in accordance with an embodiment of the present disclosure is applied.

FIG. 11 is a block diagram illustrating a memory card system 2000 to which the storage device in accordance with an embodiment of the present disclosure is applied.

Referring FIG. 11, the memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control a read operation, a write operation, an erase operation, and a background operation of the memory device 2200. The memory controller 2100 may provide an interface between the memory device 2100 and an external device (e.g., the host 300 of FIG. 1). The memory controller 2100 may drive firmware for controlling the memory device 2200. The memory controller 2100 may be embodied in the same manner as that of the memory controller 200 described with reference to FIG. 1.

In an embodiment, the memory controller 2100 may include components such as a random access memory (RAM), a processor, a host interface, and a memory interface, and an error correction code (ECC) circuit.

The memory controller 2100 may communicate with an external device through the connector 2300. The memory controller 2100 may communicate with the external device based on a specific communication protocol. In an embodiment, the memory controller 2100 may communicate with the external device through at least one of various communication protocols, such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

In an embodiment, the memory controller 2100 and the memory device 2200 may be integrated into a single semiconductor device to form a memory card, such as a personal computer memory card international association (PCMCIA), a compact flash card (CF), a smart media card (e.g., SM or SMC), a memory stick, a multimedia card (e.g., MMC, RS-MMC, or MMCmicro), a secure digital (SD) card (e.g., SD, miniSD, microSD, or SDHC), or a universal flash storage (UFS).

Figure 12:
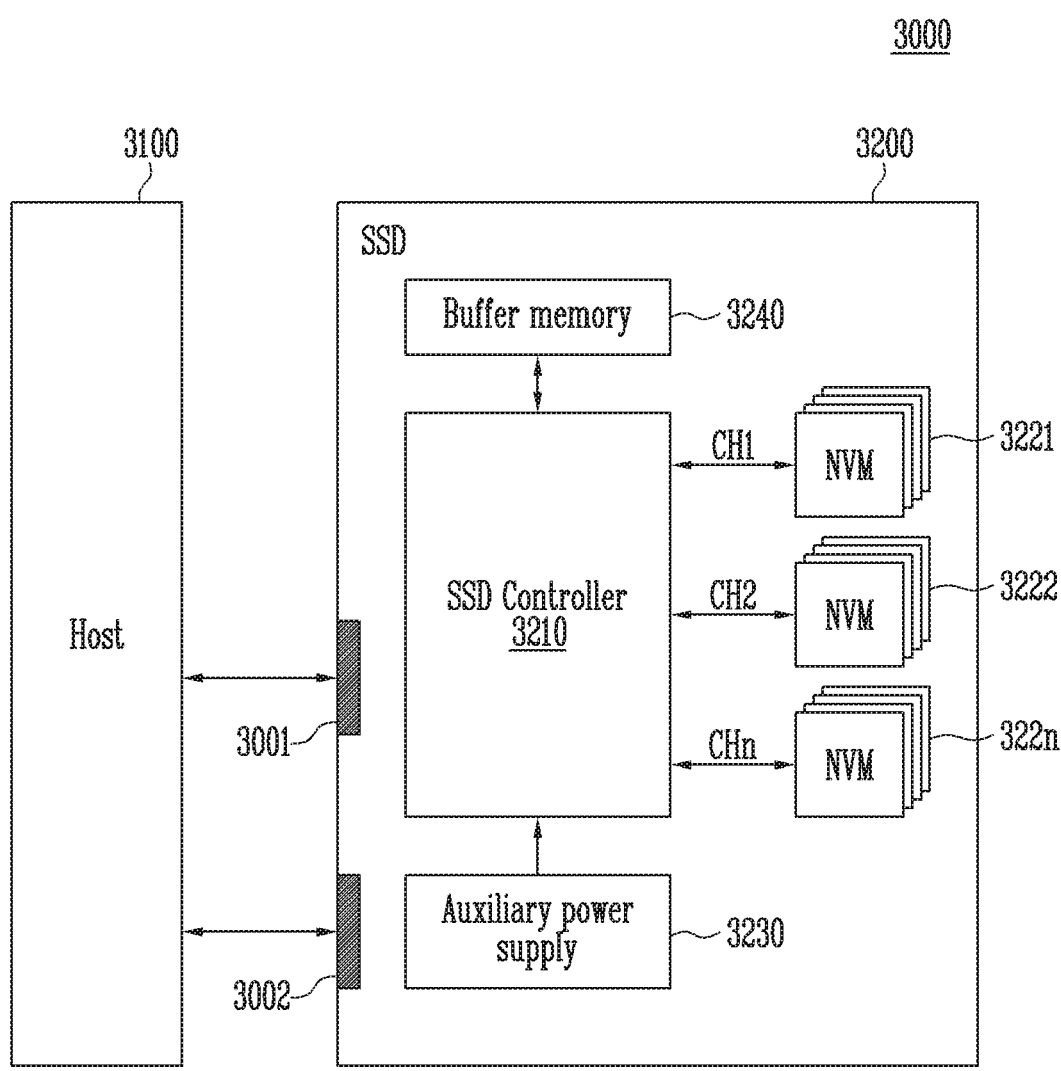
FIG. 12 is a block diagram illustrating a solid state drive (SSD) system to which the storage device in accordance with an embodiment of the present disclosure is applied.

FIG. 12 is a block diagram illustrating a solid state drive (SSD) system 3000 to which the storage device in accordance with an embodiment of the present disclosure is applied.

Referring to FIG. 12, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322*n*, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322*n* in response to the signals SIG received from the host 3100. In an embodiment, the signals SIG may be signals based on an interface between the host 3100 and the SSD 3200. For example, the signals SIG may be signals defined by at least one of various interfaces, such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and/or nonvolatile memory express (NVMe) interfaces.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly performed. In an embodiment, the auxiliary power supply 3230 may be positioned within or externally to the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322*n* or may temporarily store metadata (e.g., a mapping table) of the flash memories 3221 to 322*n*. The buffer memory 3240 may include volatile memories such as a DRAM, an SDRAM, a DDR SDRAM, an LPDDR SDRAM, and a GRAM or nonvolatile memories such as an FRAM, a ReRAM, an STT-MRAM, and a PRAM.

FIG. 13 is a block diagram illustrating a user system 4000 to which the storage device in accordance with an embodiment of the present disclosure is applied.

Referring to FIG. 13, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDARM, and an LPDDR3 SDRAM, or a nonvolatile RAM such as a PRAM, a ReRAM, an MRAM, and an FRAM. In an embodiment, the application processor 4100 and the memory module 4200 may be packaged based on package-on-package (PoP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or Wi-Fi communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be operated in the same manner as that of the memory device 100 described above with reference to FIG. 1. The storage module 4400 may be operated in the same manner as that of the storage device 50, described above with reference to FIG. 1.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a liquid crystal display (LCD), an organic light emitting diode (OLED) display device, an active matrix OLED (AMOLED) display device, an LED, a speaker, and a monitor.

Various embodiments of the present disclosure may provide a storage device capable of improving the reliability of a read operation on a set, e.g., specific type of, word line, and a method of operating the storage device.

Although embodiments of the present disclosure have been disclosed, those skilled in the art will appreciate in light of the present disclosure that various modifications, additions and substitutions are possible, without departing from the scope and spirit of the present disclosure. Thus, the present invention encompasses all such modifications, additions and substitutions to the extent they fall within the scope of the appended claims and their equivalents.

In the above-discussed embodiments, any of the steps may be selectively performed or skipped. In addition, the steps in each embodiment may not be always performed in regular order. Furthermore, the embodiments disclosed herein aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Specific terms or words used in the description should be construed in accordance with the spirit of the present disclosure without limiting the subject matter thereof. It should be understood that many variations and modifications of the basic inventive concept described herein will still fall within the spirit and scope of the appended claims and their equivalents.

What is claimed is:

1. A storage device comprising:
   a memory device configured to perform a read operation on a selected word line among a plurality of word lines; and
   a memory controller configured to control the memory device to:
   perform the read operation,
   perform a read retry operation on the selected word line, by changing a read voltage level, when the read operation fails, and
   perform an additional read retry operation on the selected word line, by changing the read voltage level and an application time of voltages related to the read operation, depending on whether the selected word line is a set word line, when the read retry operation fails.

2. The storage device according to claim 1, wherein the memory device comprises:
   a read operation processor configured to perform the read retry operation and the additional read retry operation; and
   a read retry table configured to include information about read voltage levels to be used for the read retry operation and the additional read retry operation, and information about the application time of voltage.

3. The storage device according to claim 2, wherein the memory controller comprises:
   a read retry table storage configured to store the read retry table received from the memory device; and
   a read operation controller configured to control the read operation processor to perform the read retry operation, using the read voltage levels and to perform the additional read retry operation, using the read voltage levels and the application time of voltage.

4. The storage device according to claim 3, wherein the read operation controller comprises:
   a read retry count circuit configured to count a number of times the read operation has been re-performed to generate a read retry count;

a read fail sensor configured to sense a processing failure of the read operation, the read retry operation and the additional read retry operation, and generate a fail signal corresponding to the processing failure; and a read retry operation controller configured to generate a first control command for the read retry operation and a second control command for the additional read retry operation, according to the fail signal and the read retry count, and provide the generated first or second control command to the read operation processor.

5. The storage device according to claim 4,
wherein the read retry table stores information about a read retry threshold count
wherein the read retry operation controller generates the first control command according to a result of comparing the read retry count with the read retry threshold count.

6. The storage device according to claim 4,
wherein the read retry table stores information about an additional read retry threshold count, and
wherein the read retry operation controller generates, when the selected word line is the set word line, the second control command according to a result of comparing the read retry count with a total threshold count which is a sum of the read retry threshold count and the additional read retry threshold count.

7. The storage device according to claim 4, wherein, when an error correction decoding operation fails, on results of the read operation, the read retry operation and the additional read retry operation, the read fail sensor generates the fail signal.

8. The storage device according to claim 7, wherein the memory controller comprises an error correction code (ECC) decoder configured to perform the error correction decoding operation.

9. The storage device according to claim 4, wherein at least one of the first control command and the second control command include a set parameter command.

10. A method of operating a storage device including a memory device configured to perform a read operation on a selected word line among a plurality of word lines, and a memory controller configured to control the memory device, the method comprising:
performing, when the read operation fails, a read retry operation, by changing a read voltage level; and
performing, when the read retry operation fails, an additional read retry operation, la changing the read voltage level and an application time of voltages related to the read operation, depending on whether the selected word line is a set word line.

11. The method according to claim 10, wherein the performing of the read retry operation comprises performing the read retry operation, using read voltage levels determined based on a read retry count indicative of the number of times the read operation has been re-performed, based on a result of comparing the read retry count with a read retry threshold count.

12. The method according to claim 11, wherein the performing of the read retry operation comprises repeatedly performing the read retry operation until the read retry operation passes when the read retry count is less than or equal to the read retry threshold count.

13. The method according to claim 11, wherein the performing of the additional read retry operation comprises performing, when the selected word line is the set word line, the additional read retry operation, using read voltage levels and the application time of voltage that are determined based on the read retry count, and
wherein the additional read retry operation is performed based on a result of comparing the read retry count with a total threshold count which is a sum of the read retry threshold count and an additional read retry threshold count.

14. The method according to claim 13, wherein the performing of the additional read retry operation comprises repeatedly performing the additional read retry operation until the additional read retry operation passes when the read retry count is less than or equal to the total threshold count.

15. A memory controller configured to control a memory device including a plurality of word lines, the memory controller comprising:
a read operation controller configured to control the memory device to perform a read operation on a selected word line of the plurality of word lines, perform, when the read operation fails, a read retry operation, by changing a read voltage level, and perform, when the read retry operation fails, an additional read retry operation, by changing the read voltage level and an application time of voltages related to the read operation, depending on whether the selected word line is a set word line; and
a read retry table storage configured to store information about read voltage levels to be used for the read retry operation and the additional read retry operation and information about the application time of voltage, received from the memory device.

16. The memory controller according to claim 15, wherein the read operation controller comprises:
a read retry count circuit configured to count a number of times the read operation has been re-performed to generate a read retry count;
a read fail sensor configured to generate a fail signal when an error correction decoding operation fails, on results of the read operation, the read retry operation or the additional read retry operation; and
a read retry operation controller configured to generate at least one of a first control command for the read retry operation and a second control command for the additional read retry operation, according to the fail signal and the read retry count, and provide the generated first or second control command to the memory device.

17. The memory controller according to claim 16, wherein the read retry operation controller generates the first control command according to a result of comparing the read retry count with the read retry threshold count.

18. The memory controller according to claim 16, wherein the read retry operation controller generates, when the selected word line is the set word line, the second control command according to a result of comparing the read retry count with a total threshold count which is a sum of the read retry threshold count and the additional read retry threshold count.

19. The memory controller according to claim 16, wherein at least one of the first control command and the second control command includes a set parameter command.

20. A storage device comprising:
a memory device including a plurality of word lines; and
a memory controller suitable for controlling the memory device to:

perform a read operation on a selected word line, among the plurality of word lines, based on a selected read voltage level;

when the read operation fails, perform a read retry operation on the selected word line, based on a first read voltage level different than the selected read voltage level for a first voltage application time;

when the read retry operation fails, determining whether the selected word line is a specific type of word line; and when the selected word line is the specific type of word line, perform an additional read retry operation on the selected word line, based on a second read voltage level different than the selected read voltage level and the first voltage level for a second voltage application time different than the first voltage application time.

* * * * *